United States Patent
Khon

(10) Patent No.: US 10,318,379 B2
(45) Date of Patent: Jun. 11, 2019

(54) DECODING METHOD, MEMORY STORAGE DEVICE AND MEMORY CONTROL CIRCUIT UNIT

(71) Applicant: PHISON ELECTRONICS CORP., Miaoli (TW)

(72) Inventor: Luong Khon, Ho Chi Minh (VN)

(73) Assignee: PHISON ELECTRONICS CORP., Miaoli (TW)

( * ) Notice: Subject to any disclaimer, the term of this patent is extended or adjusted under 35 U.S.C. 154(b) by 0 days.

(21) Appl. No.: 15/798,418

(22) Filed: Oct. 31, 2017

(65) Prior Publication Data

US 2019/0073266 A1 Mar. 7, 2019

(30) Foreign Application Priority Data

Sep. 5, 2017 (TW) .............................. 106130250 A

(51) Int. Cl.
*G06F 3/06* (2006.01)
*G06F 11/10* (2006.01)
*G11B 20/18* (2006.01)

(52) U.S. Cl.
CPC .......... *G06F 11/1076* (2013.01); *G06F 3/061* (2013.01); *G06F 3/0616* (2013.01); *G06F 3/0619* (2013.01); *G06F 3/0659* (2013.01); *G06F 3/0689* (2013.01); *G11B 20/1833* (2013.01)

(58) Field of Classification Search
CPC .... G06F 11/1076; G06F 3/061; G06F 3/0689; G06F 3/0659; G06F 3/0616; G06F 3/0619; G11B 20/1833
See application file for complete search history.

(56) References Cited

U.S. PATENT DOCUMENTS

| | | | |
|---|---|---|---|
| 9,785,383 B2 * | 10/2017 | Amaki | G11C 16/26 |
| 2016/0132384 A1 * | 5/2016 | Ko | G06F 11/0793 |
| | | | 714/6.11 |
| 2017/0337106 A1 * | 11/2017 | Yen | G11C 29/021 |
| 2018/0024881 A1 * | 1/2018 | Lu | G06F 11/1012 |
| 2018/0025777 A1 * | 1/2018 | Jacobvitz | G11C 11/5642 |
| 2018/0033491 A1 * | 2/2018 | Marelli | G06F 11/076 |
| 2018/0137003 A1 * | 5/2018 | Pignatelli | G06F 11/0793 |

\* cited by examiner

*Primary Examiner* — Cynthia Britt
(74) *Attorney, Agent, or Firm* — JCIPRNET

(57) ABSTRACT

A decoding method is provided according to an exemplary embodiment. The method includes: reading first data and second data from a rewritable non-volatile memory module according to a read command; generating a re-read data set if a default decoding operation performed for the first data and the second data respectively fails; reading a to-be-decoded data set from the rewritable non-volatile memory module according to the re-read data set, and performing a first decoding operation for the first data based on the to-be-decoded data set; removing identification information corresponding to the second data from the re-read data set and storing the corrected second data if the second data is corrected in the first decode operation; and transmitting the corrected first data and the corrected second data to a host system.

21 Claims, 7 Drawing Sheets

DECODING METHOD, MEMORY STORAGE DEVICE AND MEMORY CONTROL CIRCUIT UNIT

CROSS-REFERENCE TO RELATED APPLICATION

This application claims the priority benefit of Taiwan application serial no. 106130250, filed on Sep. 5, 2017. The entirety of the above-mentioned patent application is hereby incorporated by reference herein and made a part of this specification.

BACKGROUND

Technical Field

The invention relates to a decoding method, a memory storage device and a memory control circuit unit.

Description of Related Art

The markets of digital cameras, cellular phones, and MP3 players have expanded rapidly in recent years, resulting in escalated demand for storage media by consumers. The characteristics of data non-volatility, low power consumption, and compact size make a rewritable non-volatile memory module (e.g., flash memory) ideal to be built in the portable multi-media devices as cited above.

Generally, for the data correctness, data to be stored would be encoded and then stored into the rewritable non-volatile memory module. When the data is read, the read data would be decoded to correct error therein. If the error in the read data is all corrected, the corrected data would be transmitted to the host system. In some encoding/decoding technologies, data stored in multiple pages would be encoded as one block code. The data within the same block code would protect each other. For example, if specific data cannot be corrected by the corresponding error correcting code, the other data stored in other physical pages within the same block code would be used for the error correction of this specific data.

However, when the host system performs a sequential read, the same block code would be read repeatedly to correct the data to be read by the host system one by one if the data to be read includes data stored in different physical pages in the same block code and multiple data in the same block code needs to be corrected. As a result, the decoding efficiency is lowered and the wear of the memory module is accelerated.

Nothing herein should be construed as an admission of knowledge in the prior art of any portion of the present invention. Furthermore, citation or identification of any document in this application is not an admission that such document is available as prior art to the present invention, or that any reference forms a part of the common general knowledge in the art.

SUMMARY

An exemplary embodiment of the invention provides a decoding method, a memory storage device and a memory control circuit unit which are capable of improving a decoding efficiency and decreasing the wear of the memory module.

An exemplary embodiment of the invention provides a decoding method for a rewritable non-volatile memory module, and the decoding method comprises: receiving at least one read command from a host system; instructing to read first data and second data from the rewritable non-volatile memory module according to the at least one read command; generating a re-read data set if a default decoding operation respectively operated on the first data and the second data fails, wherein the re-read data set comprise identification information corresponding to the first data and the second data; instructing to read a to-be-decoded data set from the rewritable non-volatile memory module according to the identification information corresponding to the first data among the re-read data set and performing a first decoding operation on the first data based on the to-be-decoded data set; removing the identification information corresponding to the second data from the re-read data set and storing the corrected second data if the second is corrected in the first decoding operation; and transmitting the corrected first data and the corrected second data to the host system.

Another exemplary embodiment of the invention provides a memory storage device, which includes a connection interface unit, a rewritable non-volatile memory module and a memory control circuit unit. The connection interface unit is configured to couple to a host system. The memory control circuit unit is coupled to the connection interface unit and the rewritable non-volatile memory module. The memory control circuit unit is configured to receive at least one read command from the host system. The memory control circuit unit is further configured to instruct reading first data and second data from the rewritable non-volatile memory module according to the at least one read command. The memory control circuit unit is further configured to generate a re-read data set if a default decoding operation respectively operated on the first data and the second data fails, wherein the re-read data set comprise identification information corresponding to the first data and the second data. The memory control circuit unit is further configured to instruct reading a to-be-decoded data set from the rewritable non-volatile memory module according to the identification information corresponding to the first data among the re-read data set and perform a first decoding operation on the first data based on the to-be-decoded data set. The memory control circuit unit is further configured to remove the identification information corresponding to the second data from the re-read data set and store the corrected second data if the second is corrected in the first decoding operation. The memory control circuit unit is further configured to transmit the corrected first data and the corrected second data to the host system.

Another exemplary embodiment of the invention provides a memory control circuit unit, which is configured to control a rewritable non-volatile memory module. The memory control circuit unit includes a host interface, a memory interface, an error checking and correcting circuit and a memory management circuit. The host interface is configured to couple to a host system. The memory interface is configured to couple to the rewritable non-volatile memory module. The memory management circuit is coupled to the host interface, the memory interface and the error checking and correcting circuit. The memory management circuit is configured to receive at least one read command from the host system. The memory management circuit is further configured to instruct reading first data and second data from the rewritable non-volatile memory module according to the at least one read command. The memory management circuit is further configured to generate a re-read data set if a default decoding operation, performed by the error checking and correcting circuit, respectively operated on the first data and the second data fails, wherein the re-read data set comprise identification information corresponding to the first data and the second data. The memory management circuit is further configured to instruct reading a to-be-decoded data set from the rewritable non-volatile memory module according to the identification information corresponding to the first data among the re-read data set, and the error checking and correcting circuit is configured to perform a first decoding operation on the first data based on the to-be-decoded data set. The memory management circuit is further configured to remove the identification information corresponding to the second data from the re-read data set and store the corrected second data if the second is corrected in the first decoding operation. The memory management circuit is further configured to transmit the corrected first data and the corrected second data to the host system.

Based on the above, after read command(s) for the first data and the second data from the host system is received, a re-read data set is generated and the re-read data set includes identification information corresponding to the first data and the second data if the default decoding operation performed for the first data and the second data fails. According to the identification information corresponding to the first data among the re-read data set, a to-be-decoded data set is read and the first decoding operation is performed based on the to-be-decoded data set, so as to correct the first data. It is noted that, if the second data is also corrected in the first decoding operation for the first data, the identification information corresponding to the second data is removed from the re-read data set and the corrected second data is stored. Thereafter, the corrected first data and the corrected second data are transmitted to the host system. Therefore, the decoding efficiency may be improved and the wear of the memory module may be decreased.

To make the above features and advantages of the disclosure more comprehensible, several embodiments accompanied with drawings are described in detail as follows.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
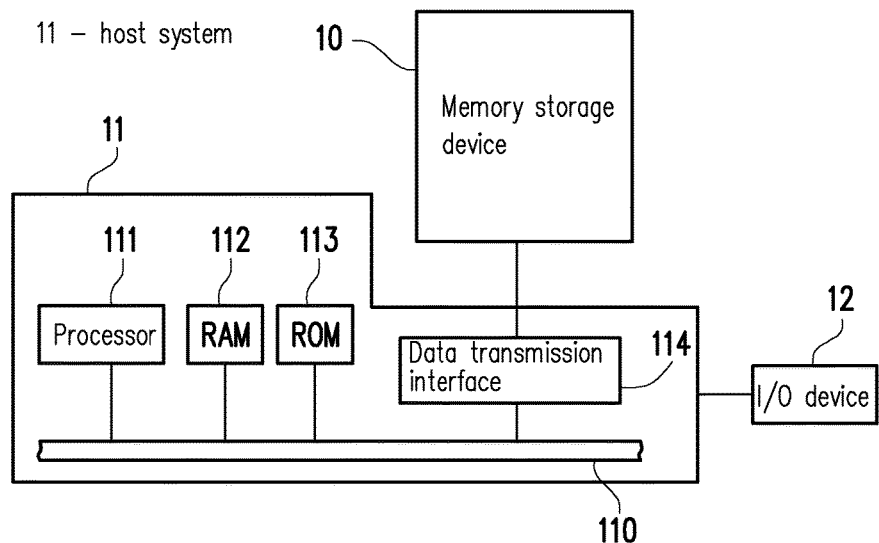
FIG. 1 is a schematic diagram illustrating a host system, a memory storage device and an I/O (input/output) device according to an exemplary embodiment of the invention.

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein.

In general, a memory storage device (a.k.a. a memory storage system) includes a rewritable non-volatile memory module and a controller (a.k.a. a control circuit). The memory storage device usually operates together with a host system so the host system can write data into the memory storage device or read data from the memory storage device.

Figure 2:
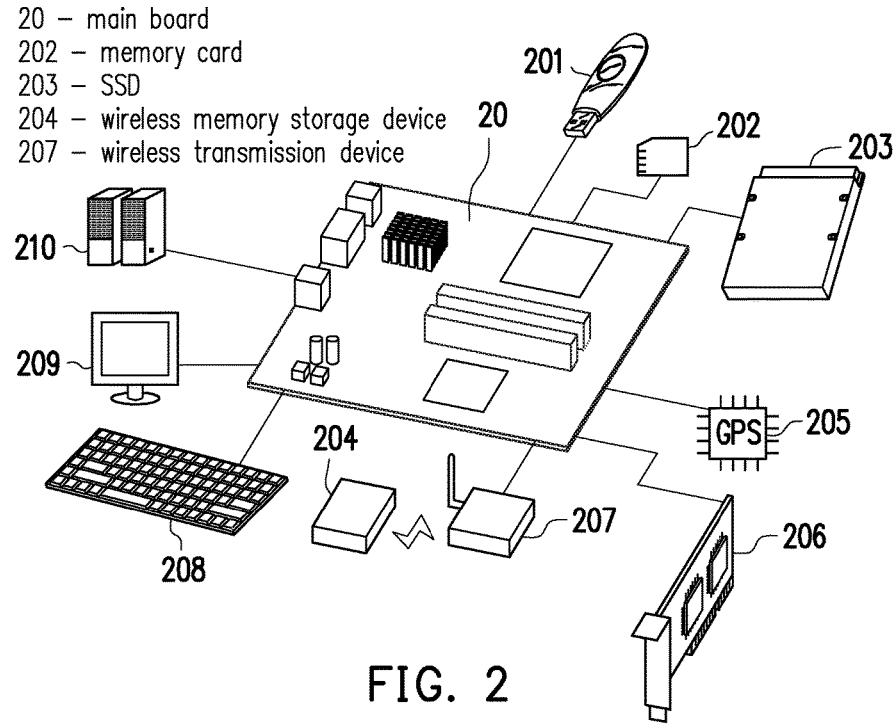
FIG. 2 is a schematic diagram illustrating a host system, a memory storage device and an I/O device according to another exemplary embodiment of the invention.

FIG. 1 is a schematic diagram illustrating a host system, a memory storage device and an I/O (input/output) device according to an exemplary embodiment of the invention. FIG. 2 is a schematic diagram illustrating a host system, a memory storage device and an I/O device according to another exemplary embodiment of the invention.

Referring to FIG. 1 and FIG. 2, a host system 11 generally includes a processor 111, a RAM (random access memory) 112, a ROM (read only memory) 113 and a data transmission interface 114. The processor 111, the RAM 112, the ROM 113 and the data transmission interface 114 are coupled to a system bus 110.

In the present exemplary embodiment, the host system 11 is coupled to a memory storage device 10 through the data transmission interface 114. For example, the host system 11 can store data into the memory storage device 10 or read data from the memory storage device 10 through the data transmission interface 114. Further, the host system 11 is coupled to an I/O device 12 via the system bus 110. For example, the host system 11 can transmit output signals to the I/O device 12 or receive input signals from the I/O device 12 via the system bus 110.

In the present exemplary embodiment, the processor 111, the RAM 112, the ROM 113 and the data transmission interface 114 may be disposed on a main board 20 of the host system 11. The number of the data transmission interface 114 may be one or more. Through the data transmission interface 114, the main board 20 may be coupled to the memory storage device 10 in wired or wireless manner. The memory storage device 10 may be, for example, a flash drive 201, a memory card 202, a SSD (Solid State Drive) 203 or a wireless memory storage device 204. The wireless memory storage device 204 may be, for example, a memory storage device based on various wireless communication technologies, such as a NFC (Near Field Communication) memory storage device, a WiFi (Wireless Fidelity) memory storage device, a Bluetooth memory storage device, a BLE (Bluetooth low energy) memory storage device (e.g., iBeacon). Further, the main board 20 may also be coupled to various I/O devices including a GPS (Global Positioning System) module 205, a network interface card 206, a wireless transmission device 207, a keyboard 208, a monitor 209 and a speaker 210 through the system bus 110. For example, in an exemplary embodiment, the main board 20 can access the wireless memory storage device 204 via the wireless transmission device 207.

Figure 3:
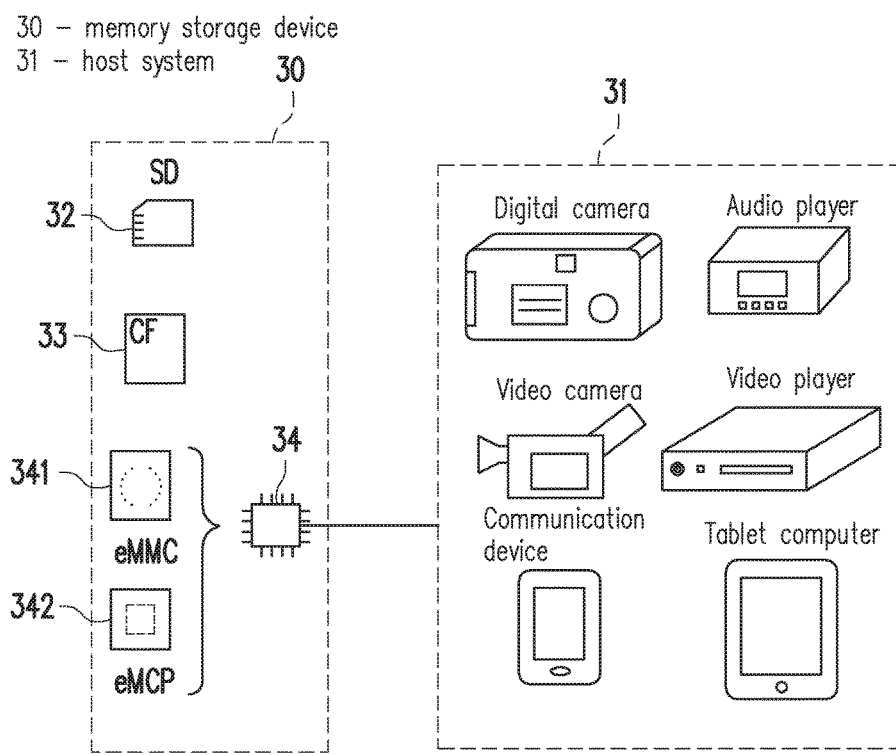
FIG. 3 is a schematic diagram illustrating a host system and a memory storage device according to another exemplary embodiment of the invention.

In an exemplary embodiment, aforementioned host system may be any system capable of substantially cooperating with the memory storage device for storing data. Although the host system is illustrated as a computer system in the foregoing exemplary embodiments, nonetheless, FIG. 3 is a schematic diagram illustrating a host system and a memory storage device according to another exemplary embodiment of the invention. Referring to FIG. 3, in another exemplary embodiment, a host system 31 may also be a system such as a digital camera, a video camera, a communication device, an audio player, a video player or a tablet computer, whereas a memory storage device 30 may be various non-volatile memory storage devices used by the host system 31, such as a SD (Secure Digital) card 32, a CF (Compact Flash) card 33 or an embedded storage device 34. The embedded storage device 34 includes various embedded storage devices capable of directly coupling a memory module onto a substrate of the host system, such as an eMMC (embedded Multi Media Card) 341 and/or an eMCP (embedded Multi Chip Package) storage device 342.

Figure 4:
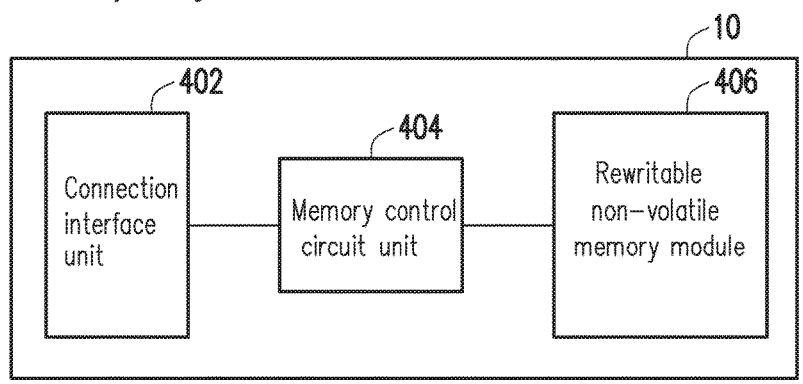
FIG. 4 is a schematic block diagram illustrating a memory storage device according to an exemplary embodiment of the invention.

FIG. 4 is a schematic block diagram illustrating a memory storage device according to an exemplary embodiment of the invention.

Referring to FIG. 4, the memory storage device 10 includes a connection interface unit 402, a memory control circuit unit 404 and a rewritable non-volatile memory module 406.

The connection interface unit 402 is configured to couple to the memory storage device 10 to the host system 11. In the present exemplary embodiment, the connection interface unit 402 is compatible with a SATA (Serial Advanced Technology Attachment) standard. Nevertheless, it should be understood that the invention is not limited to the above. The connection interface unit 402 may also be compatible with a PATA (Parallel Advanced Technology Attachment) standard, an IEEE (Institute of Electrical and Electronic Engineers) 1394 standard, a PCI Express (Peripheral Component Interconnect Express) interface standard, a USB (Universal Serial Bus) standard, a SD interface standard, a UHS-I (Ultra High Speed-I) interface standard, a UHS-II (Ultra High Speed-II) interface standard, a MS (Memory Stick) interface standard, a MCP interface standard, a MMC interface standard, an eMMC interface standard, a UFS (Universal Flash Storage) interface standard, an eMCP interface standard, a CF interface standard, an IDE (Integrated Device Electronics) interface standard or other suitable standards. The connection interface unit 402 and the memory control circuit unit 404 may be packaged into one chip, or the connection interface unit 402 may be distributed outside of a chip containing the memory control circuit unit 404.

The memory control circuit unit 404 is configured to execute a plurality of logic gates or control commands which are implemented in a hardware form or in a firmware form and perform operations, such as writing, reading or erasing data in the rewritable non-volatile memory module 406 according to the commands of the host system 11.

The rewritable non-volatile memory module 406 is coupled to the memory control circuit unit 404 and configured to store data written from the host system 11. The rewritable non-volatile memory module 406 may be a SLC (Single Level Cell) NAND flash memory module (i.e., a flash memory module capable of storing one bit in one memory cell), a MLC (Multi Level Cell) NAND flash memory module (i.e., a flash memory module capable of storing two bits in one memory cell), a TLC (Triple Level Cell) NAND flash memory module (i.e., a flash memory module capable of storing three bits in one memory cell), other flash memory modules or any memory module having the same features.

In the rewritable non-volatile memory module 406, one or more bits are stored by changing a voltage (hereinafter, also known as a threshold voltage) of each of the memory cells. More specifically, in each of the memory cells, a charge trapping layer is provided between a control gate and a channel. Amount of electrons in the charge trapping layer may be changed by applying a write voltage to the control gate thereby changing the threshold voltage of the memory cell. This operation of changing the threshold voltage of the memory cell is also known as "writing data into the memory cell" or "programming the memory cell". Each of the memory cells in the rewritable non-volatile memory module 406 has a plurality of storage states depended on changes in the threshold voltage. The storage state to which the memory cell belongs may be determined by applying a read voltage to the memory cell, so as to obtain the one or more bits stored in the memory cell.

In the present exemplary embodiment, the memory cells of the rewritable non-volatile memory module 406 constitute a plurality of physical programming units, and the physical programming units constitute a plurality of physical erasing units. Specifically, the memory cells on the same word line constitute one or more of the physical programming units. If each of the memory cells can store more than one bit, the physical programming units on the same word line can be at least classified into a lower physical programming unit and an upper physical programming unit. For instance, a least significant bit (LSB) of one memory cell belongs to the lower physical programming unit, and a most significant bit (MSB) of one memory cell belongs to the upper physical programming unit. In general, in the MLC NAND flash memory, a writing speed of the lower physical programming unit is higher than a writing speed of the upper physical programming unit, and/or a reliability of the lower physical programming unit is higher than a reliability of the upper physical programming unit.

In the present exemplary embodiment, the physical programming unit is the minimum unit for programming. That is, the physical programming unit is the minimum unit for writing data. For example, the physical programming unit is a physical page or a physical sector. When the physical programming units are the physical pages, these physical programming units usually include a data bit area and a redundancy bit area. The data bit area includes multiple physical sectors configured to store user data, and the redundant bit area is configured to store system data (e.g., management data such as an error correcting code, etc.). In the present exemplary embodiment, the data bit area includes 32 physical sectors, and a size of each physical sector is 512 bytes (B). However, in other exemplary embodiments, the data bit area may also include 8, 16 physical sectors or different number (more or less) of the physical sectors, and the size of each physical sector may also be greater or smaller. On the other hand, the physical erasing unit is the minimum unit for erasing. Namely, each physical erasing unit contains the least number of memory cells to be erased together. For instance, the physical erasing unit is a physical block.

Figure 5:
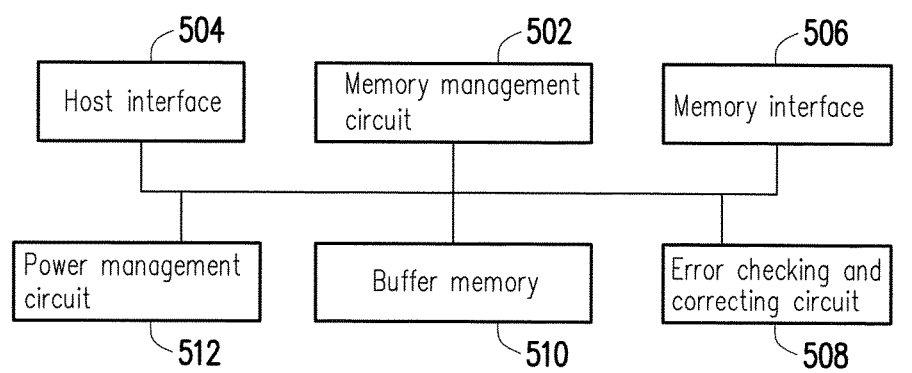
FIG. 5 is a schematic block diagram illustrating a memory control circuit unit according to an exemplary embodiment of the invention.

FIG. 5 is a schematic block diagram illustrating a memory control circuit unit according to an exemplary embodiment of the invention.

Referring to FIG. 5, the memory control circuit unit 404 includes a memory management circuit 502, a host interface 504, a memory interface 506 and an error checking and correcting circuit 508.

The memory management circuit 502 is configured to control overall operations of the memory control circuit unit 404. Specifically, the memory management circuit 502 has a plurality of control commands and the control commands are executed to perform various operations such as writing, reading and erasing data during operation of the memory storage device 10. Hereinafter, operation of the memory management circuit 502 is described as equivalent to the operation of the memory control circuit unit 404.

In the present exemplary embodiment, the control commands of the memory management circuit 502 are implemented in a firmware form. For instance, the memory management circuit 502 has a microprocessor unit (not illustrated) and a ROM (not illustrated), and the control commands are burned into the ROM. When the memory storage device 10 operates, the control commands are executed by the microprocessor to perform operations of writing, reading or erasing data.

In another exemplary embodiment, the control commands of the memory management circuit 502 may also be stored as program codes in a specific area (for example, the system area in a memory exclusively used for storing system data) of the rewritable non-volatile memory module 406. In addition, the memory management circuit 502 has a microprocessor unit (not illustrated), the read only memory (not illustrated) and a random access memory (not illustrated). More particularly, the ROM has a boot code, which is executed by the microprocessor unit to load the control commands stored in the rewritable non-volatile memory module 406 to the RAM of the memory management circuit 502 when the memory control circuit unit 404 is enabled. Then, the control commands are executed by the microprocessor unit to perform operations, such as writing, reading or erasing data.

Further, in another exemplary embodiment, the control commands of the memory management circuit 502 may also be implemented in a form of hardware. For example, the memory management circuit 502 includes a microprocessor, a memory cell management circuit, a memory writing circuit, a memory reading circuit, a memory erasing circuit and a data processing circuit. The memory cell management circuit, the memory writing circuit, the memory reading circuit, the memory erasing circuit and the data processing circuit are coupled to the microprocessor. The memory cell management circuit is configured to manage the memory cells of the rewritable non-volatile memory module 406 or a group thereof. The memory writing circuit is configured to give a write command sequence for the rewritable non-volatile memory module 406 in order to write data into the rewritable non-volatile memory module 406. The memory reading circuit is configured to give a read command sequence for the rewritable non-volatile memory module 406 in order to read data from the rewritable non-volatile memory module 406. The memory erasing circuit is configured to give an erase command sequence for the rewritable non-volatile memory module 406 in order to erase data from the rewritable non-volatile memory module 406. The data processing circuit is configured to process both the data to be written into the rewritable non-volatile memory module 406 and the data read from the rewritable non-volatile memory module 406. Each of the write command sequence, the read command sequence and the erase command sequence may include one or more program codes or command codes, and instruct the rewritable non-volatile memory module 406 to perform the corresponding operations, such as writing, reading and erasing. In an exemplary embodiment, the memory management circuit 502 may further give command sequence of other types to the rewritable non-volatile memory module 406 for instructing to perform the corresponding operations.

The host interface 504 is coupled to the memory management circuit 502 and configured to receive and identify commands and data sent from the host system 11. In other words, the commands and data transmitted by the host system 11 are transmitted to the memory management circuit 502 via the host interface 504. In the present exemplary embodiment, the host interface 504 is compatible with the SATA standard. Nevertheless, it should be understood that the invention is not limited to the above. The host interface 504 may also compatible with the PATA standard, the IEEE 1394 standard, the PCI Express standard, the USB standard, the SD standard, the UHS-I standard, the UHS-II standard, the MS standard, the MMC standard, the eMMC standard, the UFS standard, the CF standard, the IDE standard, or other suitable standards for data transmission.

The memory interface 506 is coupled to the memory management circuit 502 and configured to access the rewritable non-volatile memory module 406. In other words, data to be written into the rewritable non-volatile memory module 406 is converted into a format acceptable by the rewritable non-volatile memory module 406 via the memory interface 506. Specifically, if the memory management circuit 502 intends to access the rewritable non-volatile memory module 406, the memory interface 506 sends corresponding command sequences. For example, the command sequences may include the write command sequence which instructs to write data, the read command sequence which instructs to read data, the erase command sequence which instructs to erase data, and other corresponding command sequences for instructing to perform various memory operations (e.g., changing read voltage levels or performing a garbage collection operation). These command sequences are generated by the memory management circuit 502 and transmitted to the rewritable non-volatile memory module 406 through the memory interface 506, for example. The command sequences may include one or more signals, or data transmitted in the bus. The signals or the data may include command codes and program codes. For example, information such as identification codes and memory addresses are included in the read command sequence.

The error checking and correcting circuit 508 is coupled to the memory management circuit 502 and configured to perform an error checking and correcting operation to ensure the correctness of data. Specifically, when the memory management circuit 502 receives the write command from the host system 11, the error checking and correcting circuit 508 generates an ECC (error correcting code) and/or an EDC (error detecting code) for data corresponding to the write command, and the memory management circuit 502 writes data corresponding to the write command and the corresponding ECC and/or the EDC into the rewritable non-volatile memory module 406. Then, when the memory management circuit 502 reads the data from the rewritable non-volatile memory module 406, the corresponding ECC and/or the EDC are also read, and the error checking and correcting circuit 508 performs the error checking and correcting operation on the read data based on the ECC and/or the EDC.

In an exemplary embodiment, the memory control circuit unit 404 further includes a buffer memory 510 and a power management circuit 512.

The buffer memory 510 is coupled to the memory management circuit 502 and configured to temporarily store data and commands from the host system 11 or data from the rewritable non-volatile memory module 406. The power management unit 512 is coupled to the memory management circuit 502 and configured to control a power of the memory storage device 10.

Figure 6:
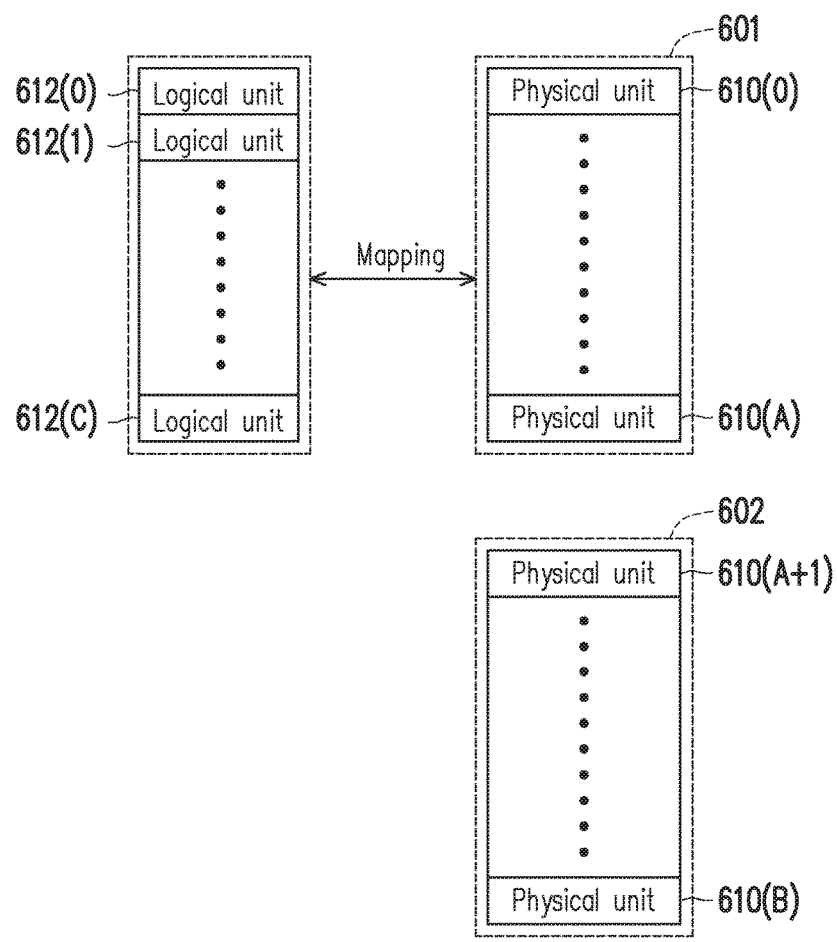
FIG. 6 is a schematic diagram illustrating management of a rewritable non-volatile memory module according to an exemplary embodiment of the invention.

FIG. 6 is a schematic diagram illustrating management of a rewritable non-volatile memory module according to an exemplary embodiment of the invention.

Referring to FIG. 6, the memory management circuit 502 logically groups physical units 610(0) to 610(B) of the rewritable non-volatile memory module 406 into a storage area 601 and a replacement area 602. The physical units 610(0) to 610(A) in the storage area 601 are configured to store data, and the physical units 610(A+1) to 610(B) in the replacement area 602 are configured to replace damaged physical units in the storage area 601. For example, if data read from one specific physical unit includes too many errors and these errors cannot be corrected, the specific physical unit is treated as a damaged physical unit. It should be noted that, if there are no available physical erasing units in the replacement area 602, the memory management circuit 502 may declare the memory storage device 10 as in a write protect state so data can no longer be written thereto.

In the present exemplary embodiment, each physical unit refers to one physical erasing unit. However, in another exemplary embodiment, one physical unit may also refer to one physical address, one physical programming unit, or a composition of a plurality of continuous or discontinuous physical addresses. The memory management circuit 502 assigns logical units 612(0) to 612(C) for mapping to the physical units 610(0) to 610(A) in the storage area 601. In the present exemplary embodiment, each logical unit refers to one logical address. However, in another exemplary embodiment, each logical unit may also refer to one logical programming unit, one logical erasing unit or a composition of a plurality of continuous or discontinuous logical addresses. In addition, each of the logical units 612(0) to 612(C) may also be mapped to one or more physical units.

The memory management circuit 502 records a mapping relation (a.k.a. a logical-to-physical address mapping relation) between the logical units and the physical units into at least one logical-to-physical address mapping table. When the host system 11 intends to read the data from the memory storage device 10 or write the data into the memory storage device 10, the memory management circuit 502 can perform a data accessing operation on the memory storage device 10 according to the logical-to-physical address mapping table.

It is noted that in the following description, some terms may be replaced with corresponding abbreviations for ease of reading (see Table 1).

TABLE 1

| rewiitable non-volatile memory module | RNVM module |
|---|---|
| logical unit | LU |
| physical unit | PU |
| memory management circuit | MMC |
| error checking and correcting circuit | ECCC |

In this exemplary embodiment, a basic unit of an encoding procedure performed by the ECCC 508 is one frame (a.k.a. a decoding frame). One frame includes a plurality of data bits. In this exemplary embodiment, one frame includes 256 bits. However, in another exemplary embodiment, one frame may also include more (e.g., 4K bytes) or less bits.

In this exemplary embodiment, the ECCC 508 can perform a single-frame encoding and decoding for the data stored in the same PU and can also perform a multi-frame encoding and decoding for data stored in multiple PUs. Each of the single-frame encoding and the multi-frame encoding may adopt encoding algorithms including at least one of a LDPC (low density parity code), a BCH code, a convolutional code or a turbo code. Alternatively, in another exemplary embodiment, the multi-frame encoding may also include a RS codes (Reed-solomon codes) algorithm or XOR (exclusive or) algorithm. Further, in another exemplary embodiment, other encoding algorithms not mentioned above may also be adopted, which are omitted herein. According to the adopted encoding algorithm, the ECCC 508 can encode the data to be protected, so as to generate the corresponding ECC and/or the EDC. Thereafter, the ECC and/or the EDC generated by encoding may be used for correcting the error in the data to be protected. For clear description, the ECC and/or the EDC generated by encoding may also be collectively known as parity data.

Figure 7:
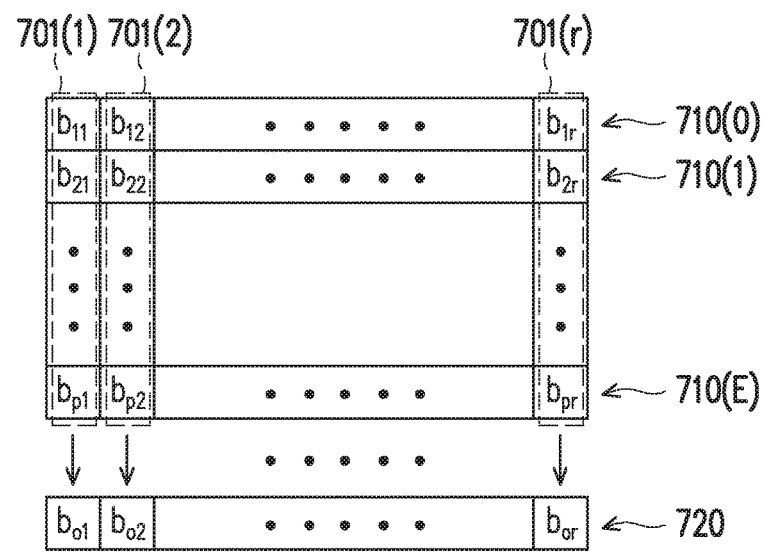
FIG. 7 is a schematic diagram illustrating a multi-frame encoding according to an exemplary embodiment of the invention.

FIG. 7 is a schematic diagram illustrating a multi-frame encoding according to an exemplary embodiment of the disclosure.

Referring to FIG. 7, parity data 720 correspondingly generated by encoding the data stored in PUs 710(0) to 710(E) is taken as an example, in which at least a part of data stored in each of the PUs 710(0) to 710(E) may be regarded as one frame. In the multi-frame encoding, the data in the PUs 710(0) to 710(E) are encoded on basis of a position of each bit (or byte). For example, bits $b_{11}$, $b_{21}$, ..., $b_{p1}$ at a position 701(1) are encoded as a bit $b_{o1}$ in the parity data 720, bits $b_{12}$, $b_{22}$, ..., $b_{p2}$ at a position 701(2) are encoded as a bit $b_{o2}$ in the parity data 720; and by analogy, bits $b_{1r}$, $b_{2r}$, ..., $b_{pr}$ at a position 701(r) are encoded as a bit $b_{or}$ in the parity data 720. Thereafter, the data read from the PUs 710(0) to 710(E) may be decoded according to the parity data 720, so as to attempt correcting possible errors in the read data.

In an exemplary embodiment, the data used for generating the parity data 720 may also include redundancy bits corresponding to the data bits in the data stored in the PUs 710(0) to 710(E). Taking the data stored in the PU 710(0) for example, the redundancy bits are, for example, generated by performing the single-frame encoding for the data bits stored in the PU 710(0).

In an exemplary embodiment, the parity data 720 may be regarded as redundant array of independent disks (RAID) error correcting code. The parity data 720 and data used for generating the parity data 720 in the PU 710(0) to 710(E) conform to the encoding rule of the RAID error correcting code. For example, the data stored in the PUs 710(0) to 710(E) may be encoded by using the encoding rule of the RAID error correcting code, so as to generate the parity data 720. Alternatively, in an exemplary embodiment, the parity data 720 and data for generating the parity data 720 in the PUs 710(0) to 710(E) may be collectively regarded as a block code.

In an exemplary embodiment, a single-frame decoding corresponding to specific data is performed first when this specific data stored in a specific PU is to be read. For example, if this specific data is encoded by single-frame encoding based on the LDPC algorithm, then this specific data may be decoded by the single-frame decoding based on the LDPC algorithm. In an exemplary embodiment, the single-frame decoding performed on data stored in a specific PU may be regarded as a default decoding operation for the data stored in this specific PU. If the single-frame decoding for this data fails, a multi-frame decoding for this data may be performed in continuous. For example, the multi-frame decoding may be performed based on the RS code which is previously used for encoding.

Figure 8:
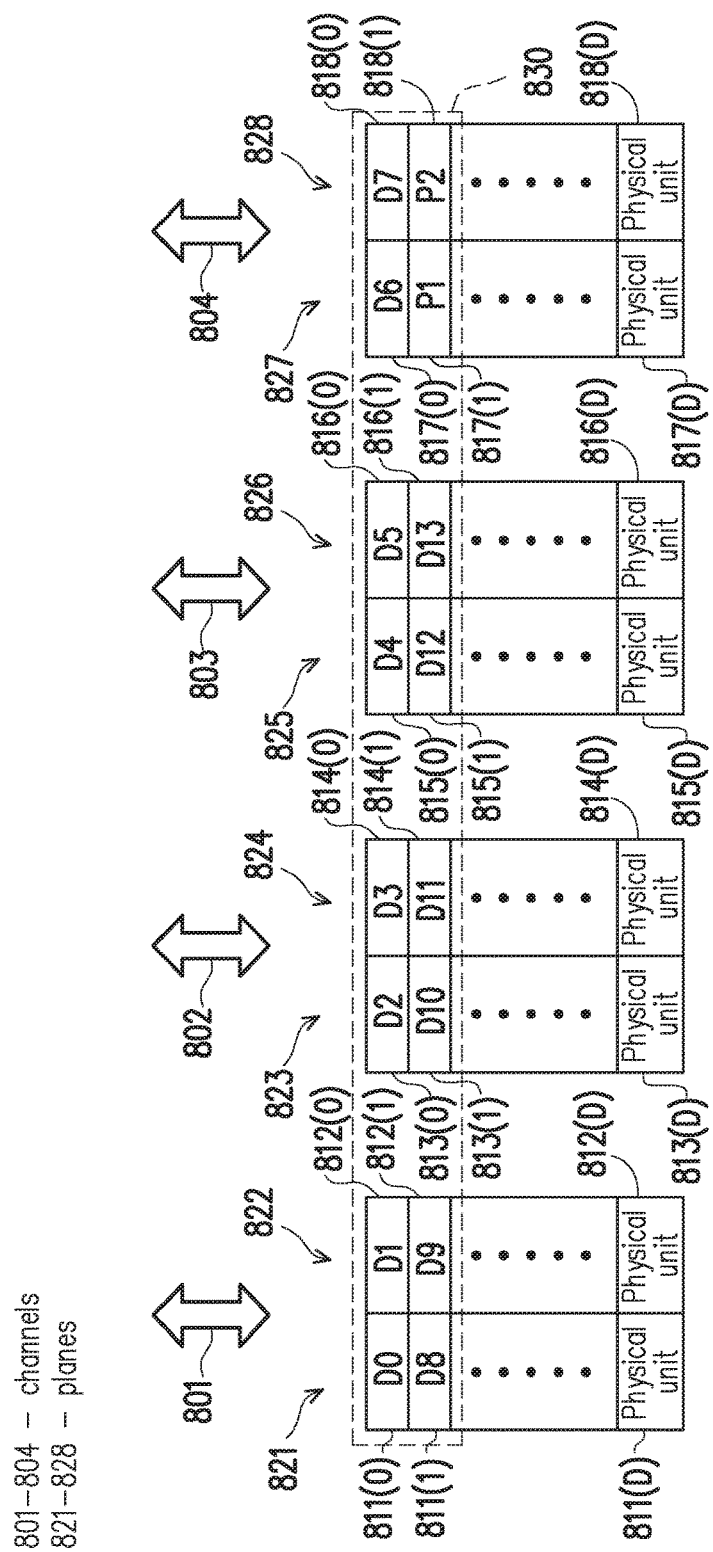
FIG. 8 is a schematic diagram illustrating a data access operation according to another exemplary embodiment of the invention.

FIG. 8 is a schematic diagram illustrating a data access operation according to another exemplary embodiment of the invention.

Referring to FIG. 8, in this exemplary embodiment, the RNVM module 406 includes a plurality of planes 821 to 828. Each of the planes 821 to 828 may also be regarded as a memory plane. The memory control circuit unit 404 may access the PUs on the planes 821 to 828 through the channel 801 to 804. For example, the memory control circuit unit 404 may access the PUs 811(0) to 811(D) on the plane 821 and the PUs 812(0) to 812(D) on the plane 822 through the channel 801; the memory control circuit unit 404 may access the PUs 813(0) to 813(D) on the plane 823 and the PUs 814(0) to 814(D) on the plane 824 through the channel 802; the memory control circuit unit 404 may access the PUs 815(0) to 815(D) on the plane 825 and the PUs 816(0) to 816(D) on the plane 826 through the channel 803; and the memory control circuit unit 404 may access the PUs 817(0) to 817(D) on the plane 827 and the PUs 818(0) to 818(D) on the plane 828 through the channel 804.

In this exemplary embodiment, at least two channel among the channel 801 to 804 support data reading or data writing in parallel. For example, specific data may be written to PUs belonging to multiple planes in parallel when this specific data is to be stored. For example, the PUs 811(0), 813(0), 815(0) and 817(0) may be programmed in parallel to stored data. Furthermore, specific data may also be read from PUs belonging to multiple plane in parallel. For example, data may be read in parallel from the PUs 811(0), 813(0), 815(0) and 817(0). Therefore, the data accessing efficiency or data accessing speed may be improved.

In this exemplary embodiment, the data D0 to D13 is stored in the PUs 811(0), 812(0), 813(0), 814(0), 815(0), 816(0), 817(0), 818(0), 811(1), 812(1), 813(1), 814(1), 815 (1), and 816(1), respectively. After a multi-frame encoding is performed on the data D0 to D13, the parity data P1 and P2 may be generated and be stored in the PUs 817(1) and 818(1). In other words, the parity data P1 and P2 may be regarded as the RAID error correcting code corresponding to the data D0 to D13, and the parity data P1 and P2 is generated by encoding the data D0 to D13 based on the encoding rule of the RAID error correcting code. Alternatively, the data D0 to D13 and the parity data P1 and P2 may also be collectively regarded as a block code. More detail of the multi-frame encoding may be referenced to the exemplary embodiment of FIG. 7, which is omitted here. Furthermore, it is assumed that the data D0 to D13 is also encoded by single-frame encoding respectively, such that each of the data D0 to D13 includes redundancy bits generated by the single-frame encoding.

In an exemplary embodiment, the MMC 502 receives at least one read command. The read command instructs to read a plurality of continuous (numbered) LUs. According to the read command, the MMC 502 instructs the RNVM module 406 to perform a sequential read operation. It is assumed that the LUs which are instructed to be read is mapped to the PUs 811(0), 812(0), 813(0), 814(0), 815(0), 816(0), 817(0) and 818(0) respectively, and the RNVM module 406 may read at least part of the data D0 to D7 from the PUs 811(0), 812(0), 813(0), 814(0), 815(0), 816(0), 817(0) and 818(0) in parallel. In an exemplary embodiment, the RNVM module 406 may first read the data D0, D2, D4 and D6 from the PUs 811(0), 813(0), 815(0), 817(0) in parallel, and then read the data D1, D3, D5 and D7 from the PUs 812(0), 814(0), 816(0), 818(0) in parallel. Alternatively, in an exemplary embodiment, the data D0 to D7 may be read in parallel and synchronously. Furthermore, in an exemplary embodiment, if the read command from the host system 11 does not instruct to read the continuous (numbered) LUs, the MMC 502 may change to instruct the RNVM module 406 to perform a random read operation, which is omitted here.

After the data D0 to D7 is obtained, the ECCC 508 may perform the default decoding operation (i.e., the single-frame decoding operation) on the data D0 to D7 respectively. If the default decoding operation performed for at least one of the data D0 to D7 fails, the MMC 502 may generate a re-read data set according to the decoding-failed data. It is noted that, the re-read data set includes identification information corresponding to the decoding-failed data. For example, the decoding-failed data refers to the data which is not decoded successfully by the default decoding operation, and the identification information corresponding to a specific decoding-failed data may include one or more identification bits corresponding to this specific decoding-failed data or may be the specific decoding-failed data itself. Furthermore, said failure of default decoding operation for specific data refers to that the performed default decoding operation cannot entirely correct all possible error existed in the specific data.

In this exemplary embodiment, it is assumed that the default decoding operation respectively performed on the data D1, D2, D4 and D7 among the data D1 to D7 to be read fails, the MMC 502 may generate a re-read data set according to the decoding-failed data (e.g., the data D1, D2, D4 and D7). The re-read data set may include identification bits ID1, ID2, ID4 and ID7 respectively corresponding to the data D1, D2, D4 and D7. According to the re-read data set, the MMC 502 may instruct the ECCC 508 to activate a multi-frame decoding procedure.

In an exemplary embodiment, after the multi-frame decoding procedure is activated, the MMC 502 may, according to the identification bit ID1 among the re-read data set, instruct reading the data D1 to D13 and the parity data P1 and P2 as the to-be-decoded data set corresponding to the data D1 from the RNVM module 406. It is noted that, the to-be-decoded data set corresponding to the data D1 may also be regarded as a block code including the data D1. The ECCC 508 may decode the data D1 (e.g., by performing a multi-frame decoding operation) based on the to-be-decoded data set, so as to correct error in the data D1.

In an exemplary embodiment, after the decoding for the data D1 is completed, the MMC 502 may, according to the identification bit ID2 among the re-read data set, instruct reading the data D1 to D13 and the parity data P1 and P2 again as the to-be-decoded data set corresponding to the data D2 from the RNVM module 406. The ECCC 508 may decode the data D2 (e.g., by performing the multi-frame decoding operation) based on the to-be-decoded data set, so as to correct error in the data D2. By analogy, according to the identification bits ID4 and ID7 among the re-read data set respectively, the MMC 502 may also instruct reading the data D1 to D13 and the parity data P1 and P2 again and again as the to-be-decoded data set respectively corresponding to the data D4 and D7 from the RNVM module 406. The ECCC 508 may decode the data D4 and D7 (e.g., by performing the multi-frame decoding operation) respectively based on the same to-be-decoded data set, so as to correct error in the data D4 and D7.

In other words, in the exemplary embodiments above, in order to perform the multi-frame decoding on the data D1, D2, D4 and D7 one by one, the same to-be-decoded data set (including the data D1 to D13 and the parity data P1 and P2) may be repeatedly read for 4 times from the RNVM module 406, which accelerates the wear of the memory module. Furthermore, the exemplary embodiments above do not consider that in the multi-frame decoding for the data D1, the used to-be-decoded data set also includes the other data D2, D4 and D7 needing to be decoded. Accordingly, the multi-frame decoding performed for the data D1 may also correct at least one of the data D2, D4 and D7 synchronously. It is assumed that the data D2 is synchronously corrected in the multi-frame decoding performed for the data D1, then the rest multi-frame decoding repeatedly performed for the data D2 is redundancy operation. This redundancy operation may lower the decoding efficiency.

Therefore, in an exemplary embodiment, after the multi-frame decoding procedure is activated, the MMC 502 may, according to the identification bit ID1 among the re-read data set, instruct reading the data D1 to D13 and the parity data P1 and P2 as the to-be-decoded data set corresponding to the data D1 from the RNVM module 406. The ECCC 508 may perform a multi-frame decoding (a.k.a. a first decoding operation) on the data D1 based on the to-be-decoded data set, so as to correct error in the data D1. However, it is noted that, in this exemplary embodiment, before the multi-frame decoding is performed for the data D2, D4 and D7, the MMC 502 may determine whether the data D2, D4 and/or D7 is also corrected in the first decoding operation performed for the data D1. If at least one of the data D2, D4 and D7 is also corrected in the first decoding operation for the data D1, the MMC 502 may update the re-read data set.

In an exemplary embodiment, it is assumed that the data D1 and D2 both is corrected by the first decoding operation of the data D1, the MMC 502 may remove the identification information ID1 and ID2 from the re-read data set, such that the updated re-read data set merely includes the identification information ID4 and ID7. Furthermore, the MMC 502 may store the corrected data D1 and the corrected data D2. For example, the corrected data D1 and the corrected data D2 may be stored in the buffer memory 510.

After the first decoding operation performed on the data D1 is completed, the MMC 502 may, according to the rest identification information ID4 among the re-read data set, instruct again reading the data D1 to D13 and the parity data P1 and P2 as the to-be-decoded data set corresponding to the data D4 from the RNVM module 406. Then, the ECCC 508 may decode the data D4 (e.g., by performing the multi-frame decoding operation) based on the to-be-decoded data set, so as to correct error in the data D4.

In an exemplary embodiment, if the data D4 and D7 both is corrected synchronously by the multi-frame decoding for the data D4, the MMC 502 may remove the identification information ID4 and ID7 from the re-read data set. Furthermore, the MMC 502 may store the corrected data D4 and the corrected data D7. For example, the corrected data D4 and the corrected data D7 may be stored in the buffer memory 510. After the data D1, D2, D4 and D7 is corrected, because the re-read data set is emptied, the MMC 502 may transmit the data D0, D3, D5 and D6 previously decoded in the corresponding default decoding operation and the data D1, D2, D4 and D7 decoded in the multi-frame operation to the host system 11, as a response for the received read command.

In an exemplary embodiment, it is possible that all of the data D1, D2, D4 and D7 is synchronously corrected in the first decoding operation for the data D1. Therefore, in this exemplary embodiment, if the first decoding operation for the data D1 is completed, the re-read data set may be emptied, and the rest multi-frame decoding operation for the data D2, D4 and D7 may be omitted and not be performed. Then, the corrected data D1, D2, D4 and D7 may be transmitted to the host system 11 with the other data previously corrected by the default decoding operation.

Traditionally, data corresponding to each identification information among the re-read data set is regarded as an independent to-be-decoded data (or a target data), and the multi-frame decoding operations performed on different target data according to the re-read data set are independent from each other and are not influenced by each other. Therefore, in tradition, once the decoding procedure enters the multi-frame decoding mode, many system resource is additionally consumed because specific target data indicated by the re-read data set is corrected repeatedly. However, with reference to the exemplary embodiments above, if the re-read data set is updated based on the performing of the multi-frame decoding operation, the reading times of the to-be-decoded data set and the performing time of the multi-frame decoding may be reduced. As a result, the decoding efficiency may be increased and the lifetime of the memory storage device may be extended.

In an exemplary embodiment, the MMC 502 may further adjust a read voltage level and instruct the RNVM module 406 to read the to-be-decoded data set by using the adjusted read voltage level when the to-be-decoded data set is read according to specific identification information among the re-read data set. Through modifying the read voltage level, the number of error bits in the read to-be-decoded data set (e.g., the data D1 to D13 and the parity data P1 and P2) may be decreased. As a result, the decoding success rate of the multi-frame decoding operation to be performed may be increased.

Figure 9:
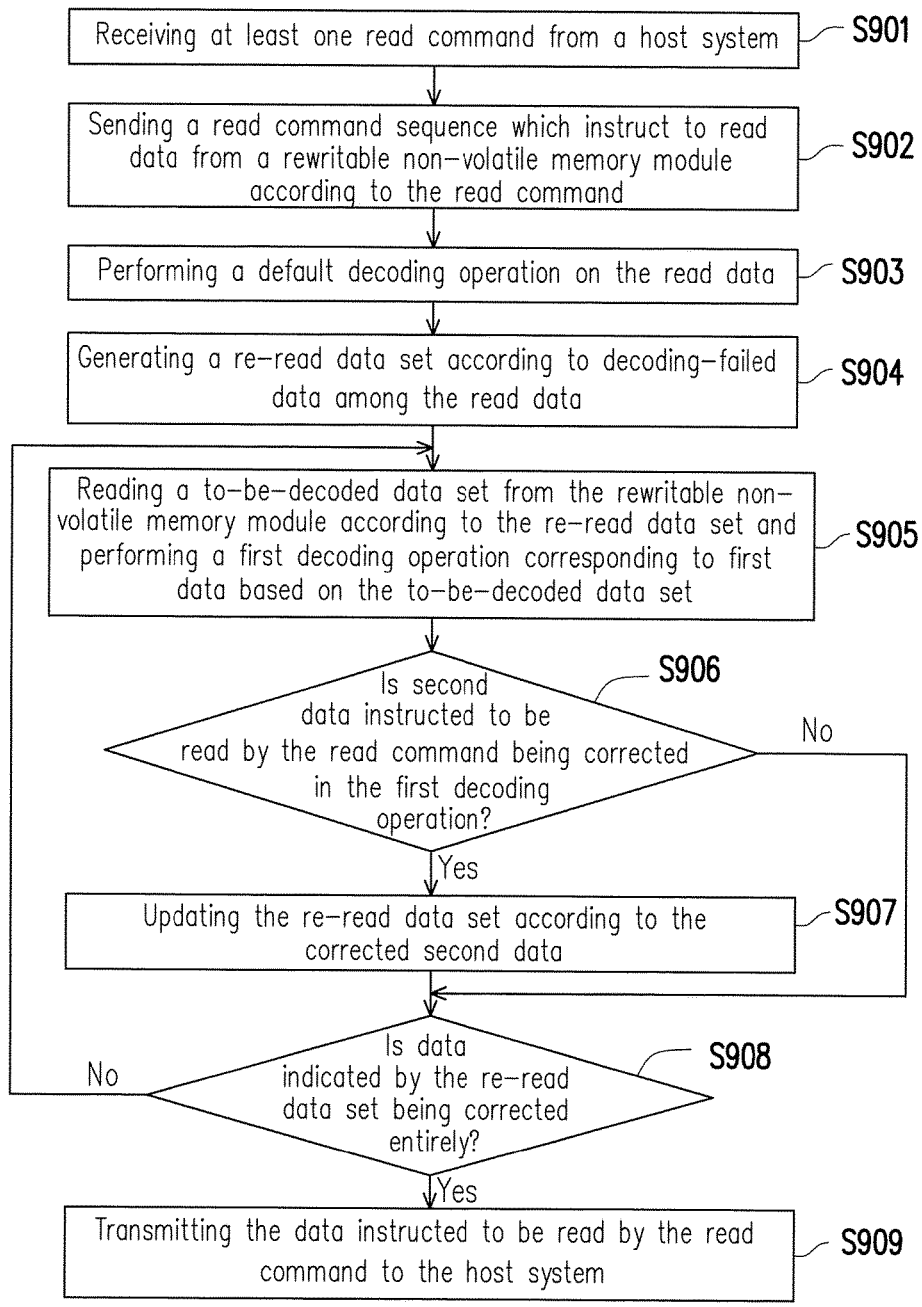
FIG. 9 is a flowchart illustrating a decoding method according to an exemplary embodiment of the invention.

FIG. 9 is a flowchart illustrating a decoding method according to an exemplary embodiment of the invention.

Referring to FIG. 9, in step S901, at least one read command is received from a host system. In step S902, a read command sequence which instructs the RNVM module to read corresponding data is sent according to the read command. In step S903, a default decoding operation is performed on the read data. In step S904, a re-read data set is generated according to the decoding-failed data among the read data. The re-read data set at least includes identification information corresponding to specific data (a.k.a. first data).

For example, the first data may be one of the decoding-failed data. In step S905, a to-be-decoded data set is read from the RNVM module according to the re-read data set and a first decoding operation corresponding to the first data is performed based on the to-be-decoded data set. In step S906, it is determined whether another specific data (a.k.a. second data) instructed to be read by the read command is corrected in the first decoding operation. If the second data is corrected in the first decoding operation, the re-read data set is updated according to the corrected second data in step S907. For example, identification information corresponding to the second data may be removed from the re-read data set. Furthermore, if it is determined that there is no second data being corrected in the first decoding operation, step S908 may be entered. In the step S908, it is determined whether data (e.g., the decoding-failed data) indicated by the re-read data set is corrected entirely. If there is still data not being corrected, the step S905 may be repeated, so as to continuously perform the first decoding operation on the rest data, indicated by the re-read data set, not being corrected. If data indicated by the re-read data set is corrected entirely (e.g., all data indicated by the re-read data set is corrected), in step S909, the (corrected) data instructed to be read by the read command is transmitted to the host system.

Nevertheless, steps depicted in FIG. 9 are described in detail as above so that related description thereof is omitted hereinafter. It should be noted that, the steps depicted in FIG. 9 may be implemented as a plurality of program codes or circuits, which are not particularly limited in the invention. Moreover, the method disclosed in FIG. 9 may be implemented by reference with above exemplary embodiments, or may be implemented separately, which are not particularly limited in the invention.

In summary, after the multi-frame decoding procedure is activated, the to-be-decoded data (or the target data) indicated by the re-read data set may be updated. If one specific target data is corrected in a multi-frame decoding operation performed for another target data, even a multi-frame decoding for this specific target data is not yet performed, this specific target data may be regarded as being corrected and the corresponding identification information may be removed from the re-read data set. Accordingly, the same data indicated by the re-read data set being decoded/corrected repeatedly may be prevented and the decoding efficiency may be improved. Furthermore, through reducing the times of reading the same to-be-decoded data set (or the same block code), the wear of the memory module may be reduced.

The previously described exemplary embodiments of the present disclosure have the advantages aforementioned, wherein the advantages aforementioned not required in all versions of the disclosure.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:
1. A decoding method for a rewritable non-volatile memory module, and the decoding method comprises:
receiving at least one read command from a host system;
instructing to read first data and second data from the rewritable non-volatile memory module according to the at least one read command;
generating a re-read data set after a default decoding operation respectively operated on the first data and the second data fails, wherein the re-read data set comprise identification information corresponding to the first data and the second data;
instructing to read a to-be-decoded data set from the rewritable non-volatile memory module according to the identification information corresponding to the first data among the re-read data set and performing a first decoding operation on the first data based on the to-be-decoded data set;
removing the identification information corresponding to the second data from the re-read data set and storing the corrected second data after the second data is corrected in the first decoding operation; and
transmitting the corrected first data and the corrected second data to the host system.

2. The decoding method according to claim 1, wherein the to-be-decoded data set comprises the first data, the second data and parity data, wherein the parity data is generated by encoding the first data and the second data, and the first data, the second data and the parity data is stored in different physical units of the rewritable non-volatile memory module.

3. The decoding method according to claim 2, wherein the parity data is generated by using an encoding rule of a redundant array of independent disks error correcting code.

4. The decoding method according to claim 1, wherein the default decoding operation respectively performed on the first data and the second data is a single-frame decoding corresponding to one physical unit, and the first decoding operation is a multi-frame decoding corresponding to a plurality of physical units.

5. The decoding method according to claim 1, wherein the step of instructing to read the to-be-decoded data set from the rewritable non-volatile memory module according to the identification information corresponding to the first data among the re-read data set comprises:
adjusting a read voltage level; and
instructing the rewritable non-volatile memory module to at least read the first data by using the adjusted read voltage level.

6. The decoding method according to claim 1, wherein the at least one read command instructs to read a plurality of continuous logical units to which the first data and the second data belongs.

7. The decoding method according to claim 1, wherein the rewritable non-volatile memory module comprises a plurality of channels, and at least part of data of the to-be-decoded data set is read through at least two channels among the channels by the rewritable non-volatile memory module in parallel.

8. A memory storage device, comprising:
a connection interface unit, configured to couple to a host system;
a rewritable non-volatile memory module; and
a memory control circuit unit, coupled to the connection interface unit and the rewritable non-volatile memory module,
wherein the memory control circuit unit is configured to receive at least one read command from the host system,
wherein the memory control circuit unit is further configured to instruct reading first data and second data from the rewritable non-volatile memory module according to the at least one read command, wherein the memory control circuit unit is further configured to generate a re-read data set after a default decoding operation respectively operated on the first data and the second data fails, wherein the re-read data set comprise identification information corresponding to the first data and the second data, wherein the memory control circuit unit is further configured to instruct reading a to-be-decoded data set from the rewritable non-volatile memory module according to the identification information corresponding to the first data among the re-read data set and perform a first decoding operation on the first data based on the to-be-decoded data set, wherein the memory control circuit unit is further configured to remove the identification information corresponding to the second data from the re-read data set and store the corrected second data after the second data is corrected in the first decoding operation, wherein the memory control circuit unit is further configured to transmit the corrected first data and the corrected second data to the host system.

9. The memory storage device according to claim 8, wherein the to-be-decoded data set comprises the first data, the second data and parity data, wherein the parity data is generated by encoding the first data and the second data, and the first data, the second data and the parity data is stored in different physical units of the rewritable non-volatile memory module.

10. The memory storage device according to claim 9, wherein the parity data is generated by using an encoding rule of a redundant array of independent disks error correcting code.

11. The memory storage device according to claim 8, wherein the default decoding operation respectively performed on the first data and the second data is a single-frame decoding corresponding to one physical unit, and the first decoding operation is a multi-frame decoding corresponding to a plurality of physical units.

12. The memory storage device according to claim 8, wherein the configured operation of instructing to read the to-be-decoded data set from the rewritable non-volatile memory module according to the identification information corresponding to the first data among the re-read data set by the memory control circuit unit comprises:
adjusting a read voltage level; and
instructing the rewritable non-volatile memory module to at least read the first data by using the adjusted read voltage level.

13. The memory storage device according to claim 8, wherein the at least one read command instructs to read a plurality of continuous logical units to which the first data and the second data belongs.

14. The memory storage device according to claim 8, wherein the rewritable non-volatile memory module comprises a plurality of channels, and at least part of data of the to-be-decoded data set is read through at least two channels among the channels by the rewritable non-volatile memory module in parallel.

15. A memory control circuit unit for controlling a rewritable non-volatile memory module, the memory control circuit unit comprises:
a host interface configured to couple to a host system;
a memory interface, configured to couple to the rewritable non-volatile memory module;
an error checking and correcting circuit; and
a memory management circuit, coupled to the host interface, the memory interface and the error checking and correcting circuit, wherein the memory management circuit is configured to receive at least one read command from the host system, wherein the memory management circuit is further configured to instruct reading first data and second data from the rewritable non-volatile memory module according to the at least one read command, wherein the memory management circuit is further configured to generate a re-read data set after a default decoding operation, performed by the error checking and correcting circuit, respectively operated on the first data and the second data fails, wherein the re-read data set comprise identification information corresponding to the first data and the second data, wherein the memory management circuit is further configured to instruct reading a to-be-decoded data set from the rewritable non-volatile memory module according to the identification information corresponding to the first data among the re-read data set, and the error checking and correcting circuit is configured to perform a first decoding operation on the first data based on the to-be-decoded data set, wherein the memory management circuit is further configured to remove the identification information corresponding to the second data from the re-read data set and store the corrected second data after the second data is corrected in the first decoding operation, wherein the memory management circuit is further configured to transmit the corrected first data and the corrected second data to the host system.

16. The memory control circuit unit according to claim 15, wherein the to-be-decoded data set comprises the first data, the second data and parity data, wherein the parity data is generated by encoding the first data and the second data, and the first data, the second data and the parity data is stored in different physical units of the rewritable non-volatile memory module.

17. The memory control circuit unit according to claim 16, wherein the parity data is generated by using an encoding rule of a redundant array of independent disks error correcting code.

18. The memory control circuit unit according to claim 15, wherein the default decoding operation respectively performed on the first data and the second data is a single-frame decoding corresponding to one physical unit, and the first decoding operation is a multi-frame decoding corresponding to a plurality of physical units.

19. The memory control circuit unit according to claim 15, wherein the configured operation of instructing to read the to-be-decoded data set from the rewritable non-volatile memory module according to the identification information corresponding to the first data among the re-read data set by the memory management circuit comprises:
adjusting a read voltage level; and
instructing the rewritable non-volatile memory module to at least read the first data by using the adjusted read voltage level.

20. The memory control circuit unit according to claim 15, wherein the at least one read command instructs to read a plurality of continuous logical units to which the first data and the second data belongs.

21. The memory control circuit unit according to claim 15, wherein the rewritable non-volatile memory module comprises a plurality of channels, and at least part of data of the to-be-decoded data set is read through at least two channels among the channels by the rewritable non-volatile memory module in parallel.

\* \* \* \* \*